(12) United States Patent
Sekimoto

(10) Patent No.: US 8,261,137 B2
(45) Date of Patent: Sep. 4, 2012

(54) APPARATUS, A METHOD AND A PROGRAM THEREOF

(75) Inventor: Takato Sekimoto, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 13/009,565

(22) Filed: Jan. 19, 2011

(65) Prior Publication Data

US 2011/0179318 A1  Jul. 21, 2011

(30) Foreign Application Priority Data

Jan. 20, 2010  (JP) ................................. 2010-009992

(51) Int. Cl.
*G06F 11/00* (2006.01)
*G11C 29/00* (2006.01)

(52) U.S. Cl. ....................................... 714/710; 714/6.32

(58) Field of Classification Search .......................... None
See application file for complete search history.

(56) References Cited

U.S. PATENT DOCUMENTS

| | | | | |
|---|---|---|---|---|
| 5,835,930 A * | 11/1998 | Dobbek | ............................ | 711/4 |
| 6,295,237 B1 * | 9/2001 | Pochmuller | .................. | 365/201 |
| 6,418,069 B2 * | 7/2002 | Schamberger et al. | ....... | 365/200 |
| 7,424,663 B2 * | 9/2008 | Mehalel | ........................ | 714/763 |
| 7,954,021 B2 * | 5/2011 | Lucas et al. | .................... | 714/723 |
| 2002/0120887 A1 * | 8/2002 | Hughes et al. | ................... | 714/42 |
| 2003/0002362 A1 * | 1/2003 | Frankowsky | ................. | 365/200 |
| 2003/0023922 A1 * | 1/2003 | Davis et al. | .................... | 714/763 |
| 2006/0161831 A1 * | 7/2006 | Mehalel | ........................ | 714/758 |
| 2008/0010494 A1 * | 1/2008 | Takizawa | ......................... | 714/5 |
| 2008/0201392 A1 * | 8/2008 | Nakajima et al. | ............. | 707/205 |
| 2008/0320327 A1 * | 12/2008 | Okawa et al. | ...................... | 714/8 |
| 2010/0199150 A1 * | 8/2010 | Shalvi et al. | .................. | 714/773 |
| 2011/0063918 A1 * | 3/2011 | Pei et al. | .................. | 365/185.18 |
| 2011/0099419 A1 * | 4/2011 | Lucas et al. | .................. | 714/6.32 |

FOREIGN PATENT DOCUMENTS

| | | |
|---|---|---|
| JP | 03-147162 A | 6/1991 |
| JP | 09-081464 A | 3/1997 |

* cited by examiner

*Primary Examiner* — Guerrier Merant
(74) *Attorney, Agent, or Firm* — Sughrue Mion, PLLC

(57) ABSTRACT

An apparatus and method for efficiently processing memory faults. A faulty memory is exchanged with a spare memory when the total number of faults in the memories is over a threshold. After the switching, when the number of faults in a single cache line is over a threshold, a memory page corresponding to the single cache line is blocked.

31 Claims, 7 Drawing Sheets

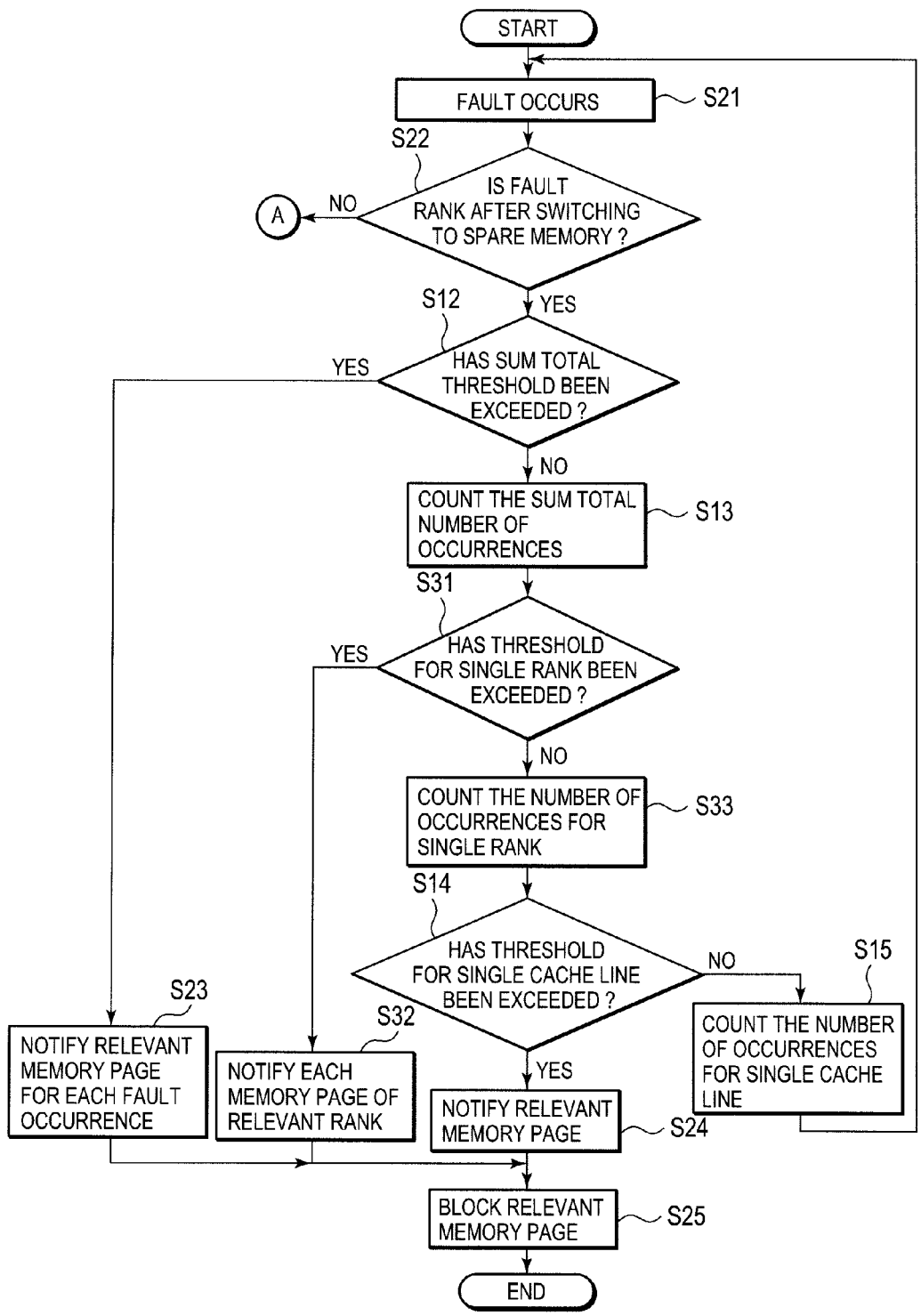

APPARATUS, A METHOD AND A PROGRAM THEREOF

This application is based upon and claims the benefit of priority from Japanese patent application No. 2010-009992, filed on Jan. 20, 2010, the disclosure of which is incorporated herein in its entirety by reference.

BACKGROUND

The present invention relates to an apparatus, a method and a program thereof capable processing a memory fault efficiently.

In an information processing apparatus such as a high-end server, it is required that system down is not caused even if a fault occurs in a memory mounted on the information processing apparatus. Therefore, a memory fault processing system is known recently which prevents system down of an information processing apparatus even if a fault occurs in a memory mounted on the information processing apparatus.

As a related technology, a memory fault processing system is known which has a memory and a spare memory, and which stores a fault memory address at which a fault has occurred, and which switches the memory to the spare memory when an accessed address corresponds to the fault memory address. As a result, it is possible to prevent system down (for example, see Japanese Patent Laid-Open No. 3-147162 (hereinafter, called as Patent Literature 1)).

As another related technology, a memory fault processing system is known which blocks a fault page when detecting a fault of a memory. This memory fault processing system holds a copy of an update image of the memory in advance, and which outputs a copy of data of a blocked fault page to a secondary storage device as a virtual memory. As a result, it is possible to prevent system down (for example, see Japanese Patent Laid-Open No. 9-81464 (hereinafter, called as Patent Literature 2).

However, the memory fault processing system described in Patent Literature 1 has a problem that, when the number of memory fault is over the number of spare memory, it is impossible to prevent system down.

In a combination of Patent Literature 1 and Patent Literature 2, a switching to spare memory and a page blocking is combined. However, there is a problem of inefficiency that a memory page corresponding to a memory where a fault has occurred is blocked though the memory where the fault occurred has been already switched to a sound spare memory.

That is, the combination of Patent Literature 1 and Patent Literature 2 can not prevent system down by efficiently combining switching to spare memory and page blocking.

An object of a certain example of the present invention is to provide an apparatus, a method and a program thereof capable of preventing a system down by efficiently combining switching to a spare memory and blocking a faulty memory page.

SUMMARY OF THE INVENTION

A non-limiting object of the present invention is to provide an apparatus, a method and a program capable of processing memory faults efficiently.

According to a non-limiting illustrative embodiment, an apparatus comprises a first counting unit configured to count the total number of faults in a plurality of memories; a switching unit configured to exchange a faulty memory with a spare memory when the total number of faults in the memories is over a threshold; and a second counting unit configured to count the number of faults in cache lines in the memories after the faulty memory is switched with the spare memories, wherein when the number of faults in a single cache line is over a threshold, a memory page corresponding to the single cache line is blocked.

According to a non-limiting illustrative embodiment, a method comprises first counting which counts the total number of faults in a plurality of memories; exchanging a faulty memory with a spare memory when the total number of faults in the memories is over a threshold; second counting which counts the number of faults in cache lines in the memories after the faulty memory is switched with the spare memories; and blocking, when the number of faults in a single cache line is over a threshold, a memory page corresponding to the single cache line.

According to a non-limiting illustrative embodiment, a computer readable medium having recorded thereon a program for enabling a computer to carry out, a method, comprises first counting which counts the total number of faults in a plurality of memories; exchanging a faulty memory with a spare memory when the total number of faults in the memories is over a threshold; second counting which counts the number of faults in cache lines in the memories after the faulty memory is switched with the spare memories; and blocking a memory page corresponding to the single cache line when the number of faults in a single cache line is over a threshold.

According to a non-limiting illustrative embodiment, a system comprises an information processing apparatus configured to include a first counting unit, a switching unit and a second counting unit; and a memory device configured to include a plurality of memories and a spare memory. The first counting unit is configured to count the total number of faults in the plurality of memories in the memory device. The switching unit is configured to exchange a faulty memory with the spare memory when the total number of faults in the memories in the memory device is over a threshold. The second counting unit is configured to count the number of faults in cache lines in the memories after the faulty memory is switched with the spare memories. When the number of faults in a single cache line is over a threshold, a memory page corresponding to the single cache line is blocked.

BRIEF DESCRIPTION OF THE DRAWINGS

Other features and advantages of the various embodiments of the present invention will become apparent by the following detailed description and the accompanying drawings, wherein:

FIG. 7 is a flowchart showing the operation of the memory fault processing system.

DETAILED DESCRIPTION

Next, a first embodiment of the present invention will be described in detail with reference to drawings.

Figure 1:
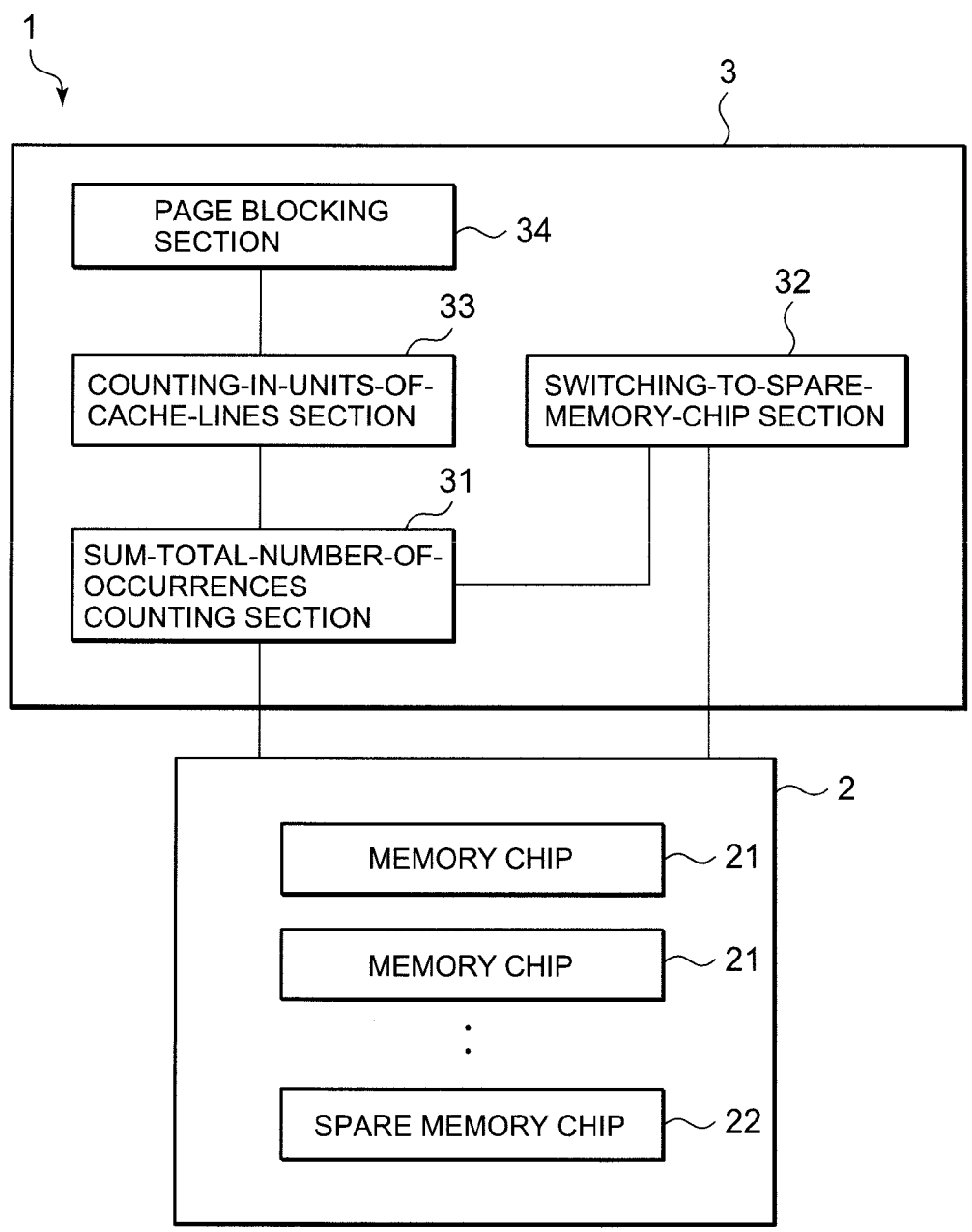
FIG. 1 is a block diagram showing the configuration of a memory fault processing system in a first exemplary embodiment of the present invention.

The configuration of a memory fault processing system 1 in a first exemplary embodiment is shown in FIG. 1. In FIG. 1, a system such as the memory fault processing system 1 is provided with a memory device 2 having memory chips 21 and a spare memory chip 22, and an information processing apparatus 3. The information processing apparatus 3 has a first counting unit such as a sum-total-number-of-occurrences counting section 31, a switching unit such as a switching-to-spare-memory-chip section 32, a second counting unit such as a counting-in-units-of-cache-lines section 33 and a page blocking section 34.

In this exemplary embodiment, two memory chips 21 and one spare memory chip 22 are shown in FIG. 1. However, the number of memory chips and spare memory chips which the memory fault processing system is provided with is not limited to this exemplary embodiment.

The configuration of the memory device 2 will be described first.

The memory device 2 is configured by a memory module such as a DIMM (Dual Inline Memory Module). The memory device 2 is mounted on the information processing apparatus 3, for example, as a RAM (Random Access Memory).

The memory chip 21 stores data inputted from the information processing apparatus 3 at a specified address and outputs data stored at a specified address in response to access from the information processing apparatus 3. The memory chip 21 is configured, for example, by a semiconductor storage element such as a DRAM (Dynamic Random Access Memory).

The spare memory chip 22 is configured similarly to the memory chip 21, and it is connected to the information processing apparatus 3 instead of the memory chip 21 via a switching circuit (not shown) to input/output data to/from the information processing apparatus 3.

Next, the configuration of the information processing apparatus 3 will be described.

The information processing apparatus 3 may be configured by a general-purpose computer apparatus having at least a memory controller for controlling the memory device 2, a CPU (Central Processing Unit), a ROM (Read Only Memory) and a storage device. In this case, the sum-total-number-of-occurrences counting section 31 is configured by the memory controller. The switching-to-spare-memory-chip section 32, the counting-in-units-of-cache-lines section 33 and the page blocking section 34 are stored in the ROM or the storage device as program modules and realized by a computer circuit executed by the CPU. For example, programs corresponding to the execution functions of the switching-to-spare-memory-chip section 32 and the counting-in-units-of-cache-lines section 33 are stored in the ROM as a BIOS (Basic Input/Output System). A program corresponding to the execution function of the page blocking section 34 is stored in the storage device as an OS (Operating System).

The sum-total-number-of-occurrences counting section 31 may be configured, for example, by an error correction circuit, such as an ECC (Error Check and Correct) circuit, and a counter circuit.

In the configuration described above, the sum-total-number-of-occurrences counting section 31 detects a fault, such as a multi-bit error, which occurs in the memory chip 21 and corrects a correctable error. The sum-total-number-of-occurrences counting section 31 also counts the sum total number of occurrences of a fault detected in each memory chip 21 managed by the memory controller and stores it.

When the sum total number of occurrences exceeds a sum total threshold, the switching-to-spare-memory-chip section 32 switches a memory chip 21 where the fault has occurred to the spare memory chip 22.

Here, as the sum total threshold, a value capable of making it possible to consider a fault which occurs in the memory chip 21 to be not a software error but a hardware error, and suitable for judging that the possibility of the memory chip 21 having failed is high.

Here, the switching-to-spare-memory-chip section 32 switches any of the memory chips 21 in which faults have occurred to the extent that the sum total number of occurrences exceeds the sum total threshold to the spare memory chip 22, regarding it as a failed memory chip.

For example, the switching-to-spare-memory-chip section 32 switches a memory chip 21 in which faults have occurs when the sum total number of occurrences exceeds the sum total threshold, to the spare memory chip 22.

The counting-in-units-of-cache-lines section 33 counts the number of fault occurrences in the memory chip 21 after the memory chip 21 is switched to the spare memory chip 22, for each cache line corresponding to memory blocks which include fault occurrence positions.

When the number of occurrences for a single cache line exceeds a threshold for single cache line before the sum total number of occurrences after switching to the spare memory exceeds the sum total threshold, the page blocking section 34 blocks a memory page which includes a cache line corresponding to the positions of the fault occurrences.

Here, as the threshold for single cache line, a value suitable for judging that the possibility of a fault which occurs in a memory chip being caused by a failure at a particular position included in a memory block corresponding to a cache line is high.

When the sum total number of occurrences exceeds the sum total threshold before the number of occurrences for a single cache line exceeds the threshold for single cache line, the page blocking section 34 blocks a memory page which includes a cache line corresponding to the position of the fault occurrence each time a fault occurs in the memory chip 21 after that.

The operation of the memory fault processing system 1 configured as described above will be described in FIGS. 2 and 3.

Figure 2:
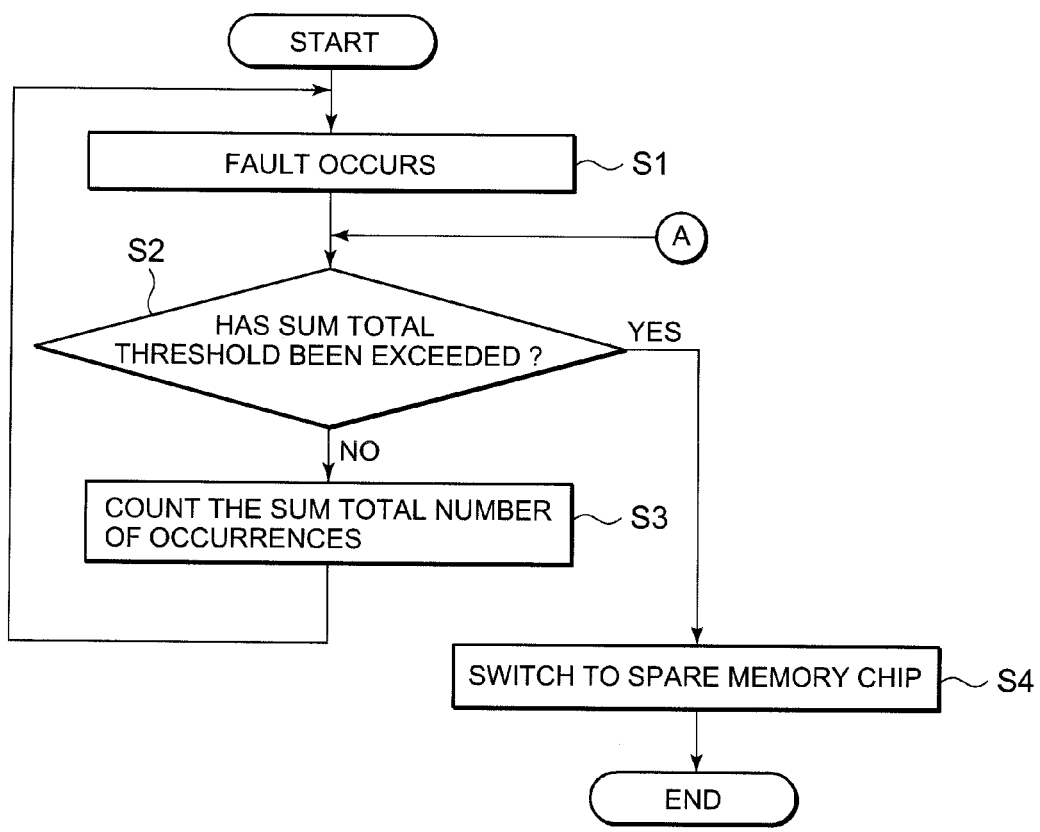
FIG. 2 is a flowchart showing a switching-to-spare-memory-chip operation of the memory fault processing system.

First, the switching-to-spare-memory-chip operation of the memory fault processing system 1 is shown FIG. 2.

Here, it is detected by the sum-total-number-of-occurrences counting section 31 first that a fault has occurred in a memory chip 21 (step S1).

Next, it is judged by the sum-total-number-of-occurrences counting section 31 whether or not the sum total number of occurrences has exceeded the sum total threshold (step S2).

Here, if it is judged that the sum total number of occurrences has not exceeded the sum total threshold, the count of the sum total number of occurrences is increased by one by the sum-total-number-of-occurrences counting section 31 (step S3). At this time, the fault which has occurred in the memory chip 21 is filtered without being notified to the switching-to-spare-memory-chip section 32. Here, the operation of the memory fault processing system 1 returns to step S1.

On the other hand, if it is judged that the sum total number of occurrences exceeded the sum total threshold, the fault which has occurred in the memory chip 21 is notified to the switching-to-spare-memory-chip section 32 by the sum-to-tal-number-of-occurrences counting section 31. Then, the memory chip 21 in which the fault has occurred is switched to the spare memory chip 22 by the switching-to-spare-memory-chip section 32 (step S4). At this time, the fault which has occurred in the memory chip 21 is not notified to the page blocking section 34 but filtered.

Then, the memory fault processing system 1 ends the switching-to-spare-memory-chip operation.

Next, the memory fault processing system 1 resets the sum-total-number-of-occurrences counting section 31 and executes a page blocking operation described below.

Figure 3:
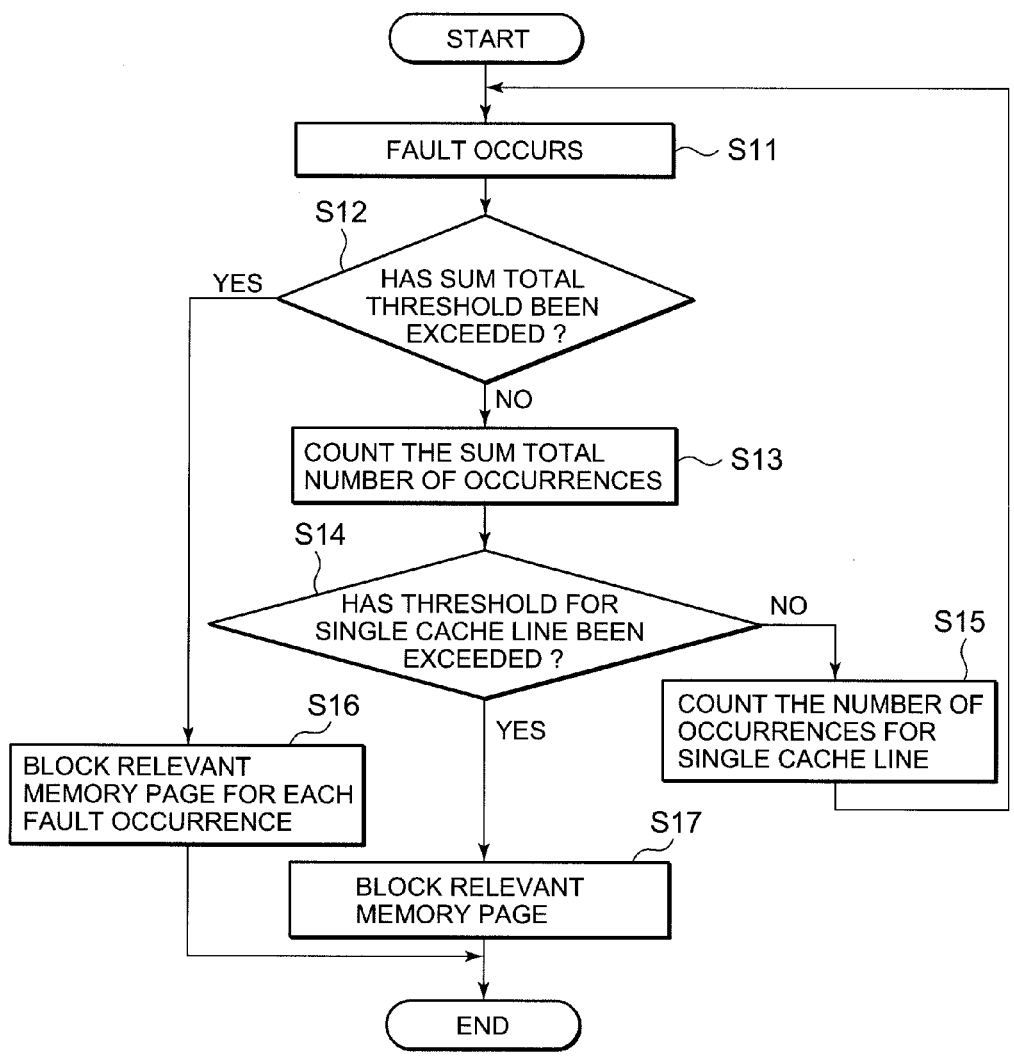
FIG. 3 is a flowchart showing an operation after switching to a spare memory chip, of the memory fault processing system.

The page blocking operation after switching to the spare memory chip 22 (after step S4) in the memory fault processing system 1 is described in FIG. 3. Here, it is detected by the sum-total-number-of-occurrences counting section 31 first that a fault occurs in the memory chip 21 after switching (step S11).

Next, it is judged by the sum-total-number-of-occurrences counting section 31 whether or not the sum total number of occurrences has exceeded the sum total threshold (step S12).

Here, if it is judged that the sum total number of occurrences has not exceeded the sum total threshold, the count of the sum total number of occurrences is increased by one by the sum-total-number-of-occurrences counting section 31 (step S13). Then, the fault which has occurred in the memory chip 21 is notified to the counting-in-units-of-cache-lines section 33 by the sum-total-number-of-occurrences counting section 31.

Next, it is judged by the counting-in-units-of-cache-lines section 33 whether or not the number of occurrences for the single cache line has exceeded the threshold for single cache line (step S14).

Here, if it is judged that the number of occurrences for the single cache line has not exceeded the threshold for single cache line, the number of occurrences for the single cache line is increased by one by the counting-in-units-of-cache-lines section 33 (step S15). At this time, the fault which has occurred in the memory chip 21 is filtered without being notified to the page blocking section 34. Here, the operation of the memory fault processing system 1 returns to step S11.

On the other hand, if it is judged at step S12 that the sum total number of occurrences after switching has exceeded the sum total threshold, the fault occurrence is notified to the page blocking section 34 by the sum-total-number-of-occurrences counting section 31 each time a fault occurs after that. Then, each time a fault occurs, a memory page which includes a cache line corresponding to the position of the fault occurrence is blocked by the page blocking section 34 (step S16). Here, the sum-total-number-of-occurrences counting section 31 is reset.

If it is judged at step S14 that the number of occurrences for the single cache line has exceeded the threshold for single cache line, occurrence of a fault is notified to the page blocking section 34 by the counting-in-units-of-cache-lines section 33. Then, a memory page which includes a cache line corresponding to the position of the fault occurrence is blocked by the page blocking section 34 (step S17). Here, the sum-total-number-of-occurrences counting section 31 is reset.

Then, the memory fault processing system 1 ends the page blocking operation after switching to spare memory chip.

Next, the advantageous effects of the first exemplary embodiment of the present invention will be described.

The memory fault processing system of the first exemplary embodiment can prevent system down by efficiently causing switching to a spare memory and page blocking of a faulty memory.

A first reason is that, when the sum total number of fault occurrences in a memory chip exceeds a threshold, the switching-to-spare-memory-chip means judges that the possibility of the memory chip where the fault has occurred having failed is high and switches the failed memory chip to a spare memory chip. Furthermore, since the memory fault processing system of the first embodiment of the present invention does not execute page blocking until the failed memory chip is switched to the spare memory chip, it is possible to efficiently perform switching to the spare memory while preventing decrease in performance due to page blocking.

A second reason is that, when the sum total number of occurrences after switching exceeds the sum total threshold before the number of occurrences for a single cache line exceeds a threshold for single cache line, the page blocking means judges that the possibility of multiple memory chips having failed is high and, blocks a memory page which includes the position of the fault occurrence each time a fault occurs after that. Thereby, the memory fault processing system of the first exemplary embodiment can prevent system down until maintenance/exchange is performed by efficiently causing page blocking to operate even if the number of memory chips beyond the number of spare memories fail.

A third reason is that, when the number of occurrences for a single cache line exceeds the threshold for single cache line before the sum total number of occurrences after switching exceeds the sum total threshold, the page blocking means judges that the possibility of failure at a particular position included in a memory block corresponding to the cache line is high and blocks a memory page which includes the cache line. Thereby, even when a failure occurs at a particular position included in another memory chip after a failed memory chip is switched to a spare memory chip, the memory fault processing system of the first exemplary embodiment can prevent system down by blocking a memory page which includes the failure position.

Next, a second exemplary embodiment of the present invention will be described in detail with reference to drawings.

Figure 4:
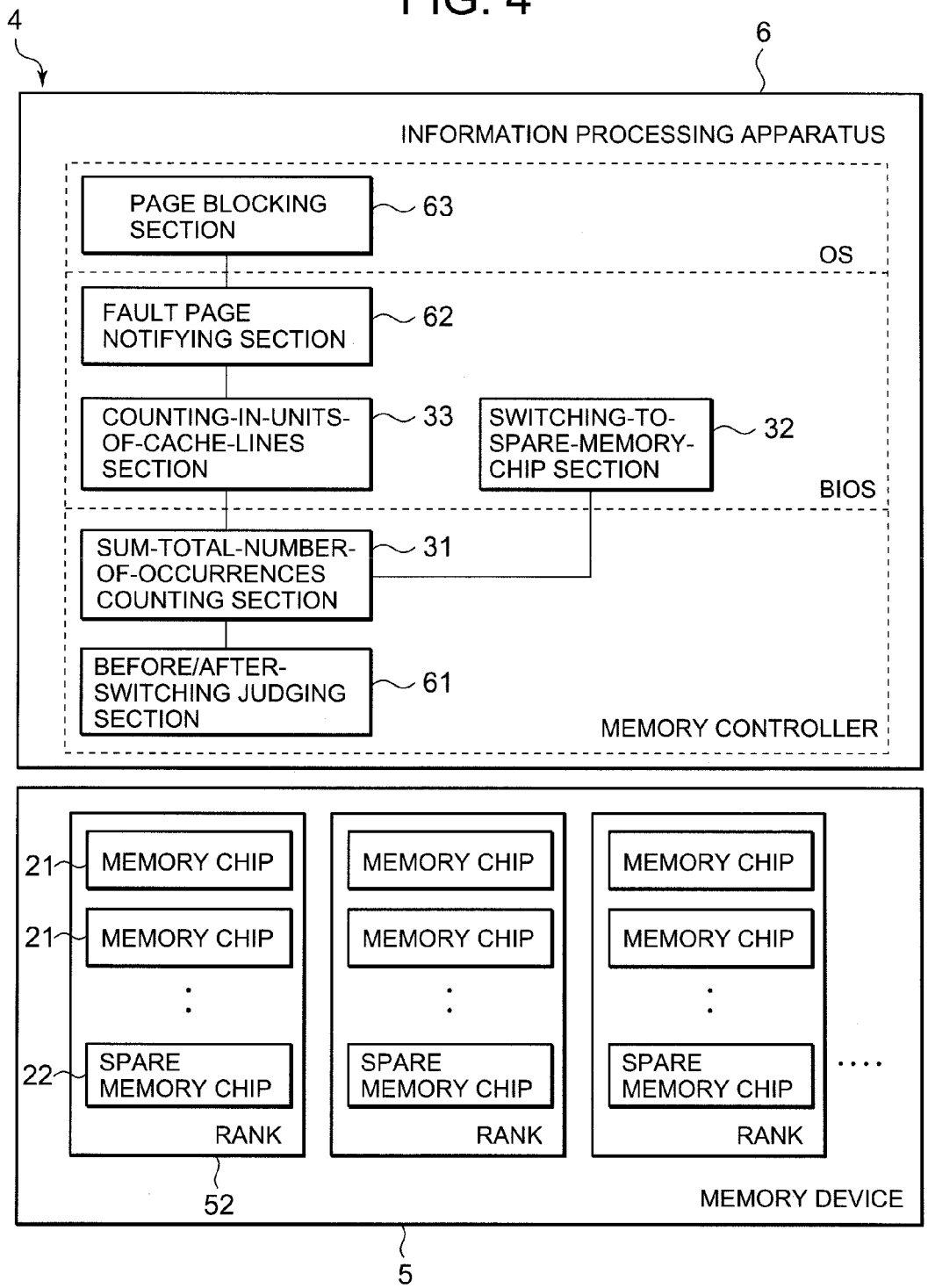
FIG. 4 is a block diagram showing the configuration of a memory fault processing system in a second exemplary embodiment of the present invention.

The configuration of a memory fault processing system 4 as the second exemplary embodiment of the present invention is shown in FIG. 4. In FIG. 4, the same components as those of the memory fault processing system 1 as the first exemplary embodiment are given the same reference numerals, and detailed description thereof will be omitted.

As shown in FIG. 4, the memory fault processing system 4 is provided with a memory device 5, and an information processing apparatus 6 mounted with the memory device 5.

The configuration of the memory device 5 will be described first.

The memory device 5 is provided with multiple ranks 52 each of which has memory chips 21 and a spare memory chip 22.

In this embodiment, three ranks 52 are shown in FIG. 4. However, the number of ranks held by the memory device is not limited to this embodiment.

The rank 52 is a management unit of data input to and output from the memory device 5. The rank 52 is configured by one or more memory modules.

Next, the configuration of the information processing apparatus 6 will be described.

Similarly to the information processing apparatus 3 in the first exemplary embodiment, the information processing apparatus 6 is configured by a general-purpose computer apparatus mounted with the memory device 5.

The information processing apparatus 6 has a before/after-switching judging section 61, a sum-total-number-of-occurrences counting section 31, a switching-to-spare-memory-chip section 32, a counting-in-units-of-cache-lines section 33, a fault page notifying section 62 and a page blocking section 63.

Here, the fault page notifying section 62 and the page blocking section 63 constitute an embodiment of the page blocking means of the present invention. The before/after-switching judging section 61 is configured by a memory controller. The fault page notifying section 62 is stored in a ROM as a BIOS, and the page blocking section 63 is stored in the storage device as an OS. Each of them is realized by a computer circuit executed by the CPU.

The before/after-switching judging section 61 judges whether a rank 52 which includes a memory chip 21 where a fault has occurred is before or after switching to spare memory chip.

For example, the before/after-switching judging section 61 has a register storing information indicating whether each rank 52 is before or after switching and judges whether before or after switching on the basis of the value of the register.

When the number of occurrences for a single cache line exceeds a threshold for single cache line before the sum total number of occurrences after switching to the spare memory exceeds the sum total threshold, the fault page notifying section 62 notifies a memory page which includes a cache line corresponding to the positions of the fault occurrences, to the page blocking section 63.

When the sum total number of occurrences exceeds the sum total threshold before the number of occurrences for a single cache line exceeds the threshold for single cache line, the fault page notifying section 62 notifies a memory page which includes a cache line corresponding to the position of the fault occurrence each time a fault occurs in the memory chip 21, to the page blocking section 63 after that.

The page blocking section 63 blocks the memory page notified from the fault page notifying section 62.

The operation of the memory fault processing system 4 configured as described above will be described in FIG. 5.

Figure 5:
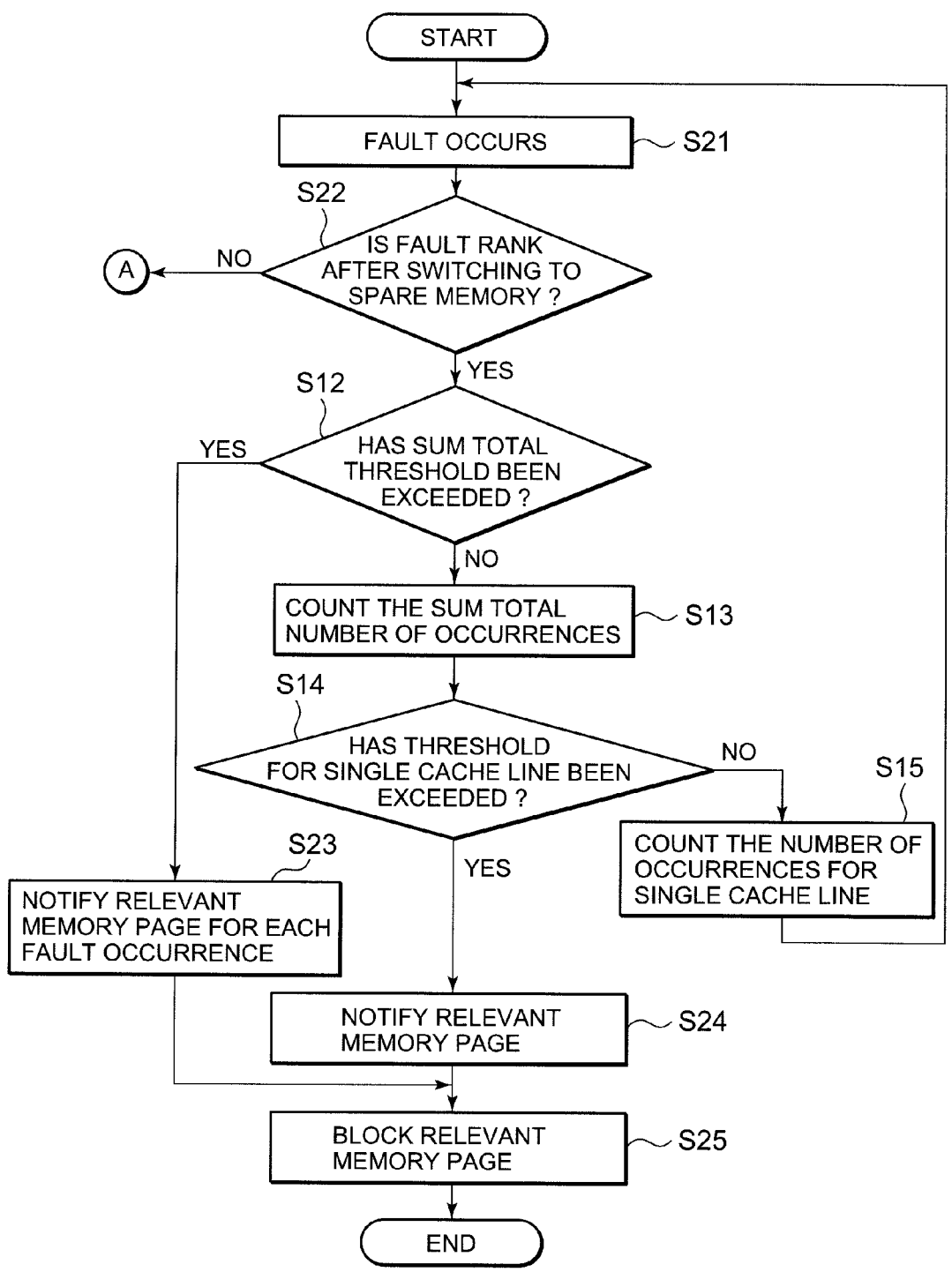
FIG. 5 is a flowchart showing the operation of the memory fault processing system.

In FIG. 5, steps which operate similarly to the memory fault processing system 1 as the first exemplary embodiment are given the same reference numerals, and detailed description thereof will be omitted.

Here, it is detected by the sum-total-number-of-occurrences counting section 31 first that a fault has occurred in the memory chip 21 (step S21).

Next, it is judged by the before/after-switching judging section 61 whether a rank 52 which includes the memory chip 21 where a fault has occurred is before or after switching to spare memory chip (step S22).

Here, if it is judged that the relevant rank 52 is before switching to spare memory chip, the switching-to-spare-memory-chip operation shown in FIG. 2 is executed similarly to the memory fault processing system 1 as the first exemplary embodiment.

That is, if the sum total number of occurrences has exceeded the sum total threshold when the fault occurs in the memory chip 21 included in the rank 52 before switching to spare memory chip, the memory chip 21 where the fault has occurred is switched to the spare memory chip 22 by the switching-to-spare-memory-chip section 32. If the sum total number of occurrences has not exceeded the sum total threshold, the sum total number of occurrences is counted by the sum-total-number-of-occurrences counting section 31.

On the other hand, if it is judged at step S2 that the relevant rank 52 is after switching to spare memory chip, the operations are performed at steps S12 to S15 similarly to the memory fault processing system 1 as the first exemplary embodiment.

That is, if the sum total number of occurrences has not exceeded the sum total threshold and the number of occurrences for the single cache line has not exceeded the threshold for single cache line when the fault occurs in the memory chip 21 included in the rank 52 after switching to spare memory chip, then each of the sum total number of occurrences and the number of occurrences for the single cache line is counted.

If the number of occurrences for the single cache line has not exceeded the threshold for single cache line, and the sum total number of occurrences has exceeded the sum total threshold (step S12: Yes), then, each time a fault occurs after that, a memory page which includes a cache line corresponding to the position of the fault occurrence is notified to the page blocking section 63 by the fault page notifying section 62 (step S23).

If the sum total number of occurrences has not exceeded the sum total threshold, and the number of occurrences for the single cache line has exceeded the threshold for single cache line (step S14: Yes), then a memory page which includes the cache line corresponding to the position of the fault occurrence is notified to the page blocking section 63 by the fault page notifying section 62 (step S24).

Next, the notified memory page is blocked by the page blocking section 63 (step S25).

Then, the memory fault processing system 4 ends the operation.

Next, the advantageous effects of the second embodiment of the present invention will be described.

In the case of being mounted with a memory device managed with multiple ranks each of which has a spare memory, the memory fault processing system in the second exemplary embodiment can prevent system down by efficiently causing switching to spare memory and page blocking to a faulty memory for each rank.

A first reason is that the before/after-switching judging means judges whether a rank which includes a memory chip where a fault has occurred is before or after switching to spare memory chip, and the switching-to-spare-memory-chip means executes switching to spare memory chip on the basis of the sum total number of occurrences if the rank where the fault has occurred is before switching to spare memory chip. Thereby, the memory fault processing system in the second exemplary embodiment can efficiently perform switching to spare memory chip for each rank without executing page blocking for a fault which occurs in a rank before switching.

A second reason is that the counting-in-units-of-cache-lines means counts the number of fault occurrences in a rank after switching, and the page blocking means blocks a relevant memory page on the basis of the number of occurrences for single cache line and the sum total number of occurrences. Thereby, the memory fault processing system as the second exemplary embodiment can efficiently perform page blocking for a fault which, occurs in a rank after switching to spare memory chip.

Next, a third exemplary embodiment of the present invention will be described in detail with reference to the drawings.

Figure 6:
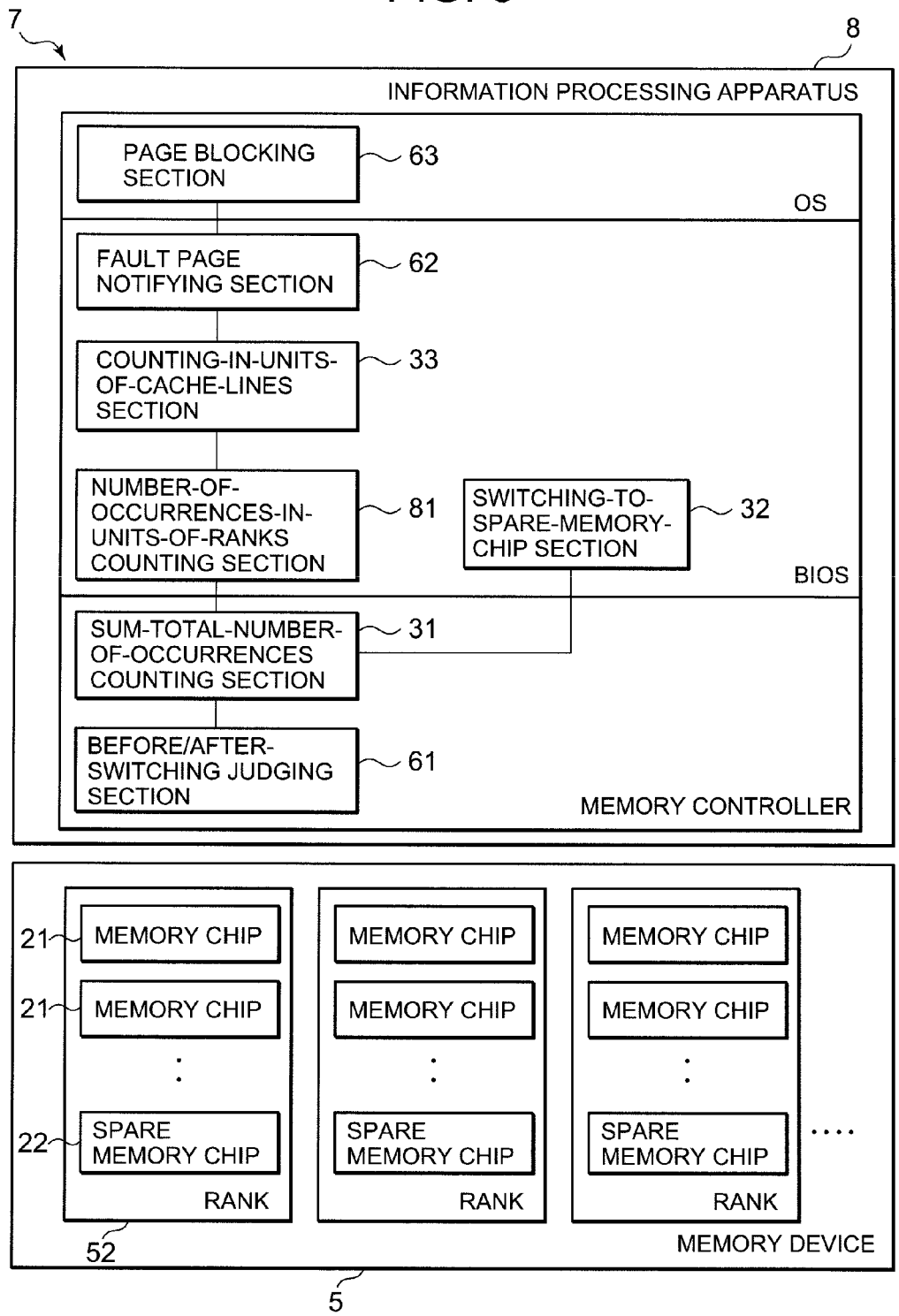
FIG. 6 is a block diagram showing the configuration of a memory fault processing system in a third exemplary embodiment of the present invention.

The configuration of a memory fault processing system 7 in a third exemplary embodiment is shown in FIG. 6. In FIG. 6, the same components as those of the memory fault processing system 4 in the second exemplary embodiment are given the same reference numerals, and detailed description thereof will be omitted.

As shown in FIG. 6, the memory fault processing system 7 is provided with a memory device 5 and an information processing apparatus 8.

The information processing apparatus 8 is provided with a third counting unit such as a number-of-occurrences-in-units-of-ranks counting section 81 in addition to the same configuration of the information processing apparatus 6 in the second exemplary embodiment.

Here, the number-of-occurrences-in-units-of-ranks counting section 81 is stored in a ROM as a program module constituting BIOS and realized by a computer circuit executed by the CPU.

After a memory chip 21 is switched to a spare memory chip 22, the number-of-occurrences-in-units-of-ranks counting section 81 counts the number of fault occurrence in a memory chip 21 for each rank 52 which includes the memory chip 21 where the fault has occurred.

A fault page notifying section 62 stores information regarding cache lines associated with the ranks 52 in advance. If the number of occurrences for a single rank exceeds a threshold for single rank before the sum total number of occurrences after switching to spare memory exceeds a sum total threshold, the fault page notifying section 62 notifies memory pages which include cache lines corresponding to the rank 52 which has exceeded the threshold, respectively, to a page blocking section 63.

Here, as the threshold for single rank, a value suitable for judging that the possibility of a fault which occurs in a memory chip 21 in a rank 52 being caused by multiple memory module failures included in the rank 52 is high.

The operation of the memory fault processing system 7 configured as described above will be described with reference with FIG. 7.

In FIG. 7, steps which operate similarly to the memory fault processing system 4 in the second exemplary embodiment are given the same reference numerals, and detailed description thereof will be omitted.

First, by performing operations at steps S21 to S22 similarly to the memory fault processing system 4 in the second exemplary embodiment, the memory fault processing system 7 executes the switching-to-spare-memory-chip operation shown in FIG. 2 if a fault occurs in a rank 52 before switching to the spare memory chip 22.

On the other hand, if a fault occurs in a rank 52 after switching to the spare memory chip 22, the memory fault processing system 7 executes steps S12, S13 and S23 similarly to the memory fault processing system 4 in the second exemplary embodiment. That is, if the sum total number of occurrences exceeds the sum total threshold, a memory page which includes a cache line corresponding to the position of the fault occurrence is notified to the page blocking section 63 by the fault page notifying section 62 each time a fault occurs, after that. If the sum total number of occurrences has not exceeded the sum total threshold, the count of the sum total number of occurrences is increased by one by the sum-total-number-of-occurrences counting section 31.

Next, it is judged by the number-of-occurrences-in-units-of-ranks counting section 81 whether or not the number of occurrences for the single rank has exceeded the threshold for single rank (step S31).

Here, if it is judged that the number of occurrences for the single rank has exceeded the threshold for single rank, memory pages which include cache lines associated with rank 52 which has exceeded the threshold, respectively, are notified to the page blocking section 63 by the fault page notifying section 62 (step S32).

On the other hand, if it is judged that the number of occurrences for the single rank has not exceeded the threshold for single rank, the count of the number of occurrences for the single rank 52 which includes the memory chip 21 where the fault has occurred is increased by one by the number-of-occurrences-in-units-of-ranks counting section 81 (step S33).

Next, the memory fault processing system 7 executes steps S14, S15 and S24 similarly to the memory fault processing system 4 in the second exemplary embodiment. That is, if the number of occurrences for the single cache line has not exceeded the threshold for single cache line, the count of the number of occurrences for the single cache line is increased by one by the counting-in-units-of-cache-lines section 33, and the operation returns to step S21. If the number of occurrences for the single cache line has exceeded the threshold for single cache line, a memory page which includes a cache line corresponding to the position of the fault occurrence is notified to the page blocking section 63 by the fault page notifying section 62.

Next, the memory page notified by the fault page notifying section 62 is blocked by the page blocking section 63 (step S25), and the memory fault processing system 7 ends the operation.

Next, the advantageous effects of the third exemplary embodiment will be described.

The memory fault processing system of the third exemplary embodiment can efficiently perform page blocking in the case where multiple memory chips in a particular rank have failed.

The reason is that the counting-in-units-of-ranks means counts the number of occurrences for a single rank which includes a memory chip where a fault has occurred, and the page blocking means blocks memory pages which include cache lines associated with the rank if the number of occurrences for the single rank exceeds the threshold for single rank before the sum total number of occurrences exceeds the sum total threshold.

In each of the embodiments of the present invention described above, a value larger than the threshold for single cache line is set as the sum total threshold in advance.

Thereby, when the sum total number of occurrences exceeds the sum total threshold before the number of occurrences for a single cache line exceeds the threshold for single cache line, the memory fault processing system can judge more certainly that the possibility of failures having occurred in multiple memory chips is high, and can execute more efficient page blocking.

Thereby, when the number of occurrences for a single cache line exceeds the threshold for single cache line before the sum total number of occurrences exceeds the sum total threshold, the memory fault processing system can judge more certainly that the possibility of a failure having occurred at a particular position is high and execute more efficient page blocking.

In the third exemplary embodiment described above, a value smaller than the sum total threshold and larger than the threshold for single cache line is set as the threshold for single rank.

Thereby, when the number of occurrences for a single rank exceeds the threshold for single rank before the sum total number of occurrences exceeds the sum total threshold, the memory fault processing system can judge more certainly that the possibility of failures having occurred in multiple memory chips constituting a particular rank is high and execute more efficient page blocking.

In the embodiments of the present invention described above, the operation of the information processing apparatus may be stored in the ROM and the storage device of the information processing apparatus as a program module constituting the memory fault processing program and executed by the CPU.

The embodiments of the present invention described above can be appropriately combined and implemented.

The present invention is not limited to the embodiments described above but can be practiced in various aspects.

What is claimed is:

1. An apparatus comprising:
a first counting unit configured to count the total number of faults in a plurality of memories;
a switching unit configured to physically exchange a faulty memory with a spare memory when the total number of faults in the memories is over a threshold; and
a second counting unit configured to count the number of faults in cache lines in the memories after the faulty memory is switched with the spare memories,
wherein when the number of faults in a single cache line is over a threshold, a memory page corresponding to the single cache line is blocked.

2. The apparatus according to claim 1,
wherein after a faulty memory has been exchanged, when the number of faults in a cache line is over a threshold and the total number of faults in the memories is not over a threshold, a memory page corresponding to the cache line is blocked, and
wherein the total number of faults in the memories is reset after the faulty memory is switched for spare memory.

3. The apparatus according to claim 1,
wherein after a faulty memory has been exchanged, when the number of faults in a cache line is not over a threshold and the total number of faults in the memories is over a threshold, a faulty memory page is blocked,
wherein the total number of faults in the memories is reset after the faulty memory is switched for spare memory.

4. The apparatus according to claim 1, further comprising:
a plurality of ranks each of which includes a plurality of memories and a spare memory; and
a switching determination unit configured to determine whether or not a faulty memory in a rank is exchanged with a spare memory in the rank;
wherein the switching unit is configured to exchange a faulty memory with a spare memory in the same rank as the faulty memory when the total number of faults in the memories is over a threshold, and
wherein the second counting unit is configured to count the number of faults in cache lines in the memories in the same rank as the faulty memory after the faulty memory is switched with the spare memories.

5. The apparatus according to claim 4, further comprising:
wherein after a faulty memory has been exchanged, when the number of faults in a cache line in memories in the same rank as the faulty memory is over a threshold and the total number of faults in the memories is not over a threshold, a memory page corresponding to the cache line is blocked, and
wherein the total number of faults in the memories is reset after the faulty memory is switched for spare memory.

6. The apparatus according to claim 5,
wherein after a faulty memory has been exchanged, when the number of faults in a cache line in memories in the same rank as the faulty memory is not over a threshold and the total number of faults in the memories is over a threshold, a faulty memory page is blocked, wherein the total number of faults in the memories is reset after the faulty memory is switched for spare memory.

7. The apparatus according to claim 4, further comprising:
a third counting unit configured to count the total number of faults in a cache line in memories in each of the ranks;
wherein when the total number of faults in a single cache line in the memories in a rank is over a threshold and the total number of faults in the memories is not over a threshold, a memory page corresponding to the single cache line is blocked.

8. The apparatus according to claim 1,
wherein a threshold of the total number of faults in the memories is larger than a threshold of the number of faults in a cache line.

9. The apparatus according to claim 7,
wherein a threshold of the total number of faults in a cache line in memories in each of the ranks is smaller than a threshold of the total number of faults in the memories, and
wherein the threshold of the total number of faults in a cache line in memories in each of the ranks is larger than a threshold of the total number of faults in the memories.

10. The apparatus according to claim 1,
wherein a memory is a memory chip and a spare memory is a spare memory chip.

11. A method comprising:
first counting which counts the total number of faults in a plurality of memories;
exchanging a faulty memory with a spare memory when the total number of faults in the memories is over a threshold;
second counting which counts the number of faults in cache lines in the memories after the faulty memory is switched with the spare memories; and
blocking, when the number of faults in a single cache line is over a threshold, a memory page corresponding to the single cache line.

12. The method according to claim 11, further comprising:
resetting the total number of faults in the memories after the exchanging step, and
wherein after the exchanging step, when the number of faults in a cache line is over a threshold and the total number of faults in the memories is not over a threshold, a memory page corresponding to the cache line is blocked in the blocking step.

13. The method according to claim 11, further comprising:
resetting the total number of faults in the memories after the exchanging step, and
wherein after the exchanging step, when the number of faults in a cache line is not over a threshold and the total number of faults in the memories is over a threshold, a faulty memory page is blocked in the blocking step.

14. The method according to claim 11, further comprising:
determining a plurality of ranks each of which includes a plurality of memories and a spare memory; and
determining whether or not a faulty memory in a rank is exchanged with a spare memory in the rank;
wherein a faulty memory is exchanged with a spare memory in the same rank as the faulty memory when the total number of faults in the memories is over a threshold in the exchanging step, and
wherein after the exchanging step, the number of faults in cache lines in the memories in the same rank as the faulty memory is counted in the second counting step.

15. The method according to claim 14, further comprising:
resetting the total number of faults in the memories after the exchanging step, and wherein after the exchanging step, when the number of faults in a cache line in memories in the same rank as the faulty memory is over a threshold and the total number of faults in the memories is not over a threshold, a memory page corresponding to the cache line is blocked in the blocking step.

16. The method according to claim 15, further comprising: resetting the total number of faults in the memories after the exchanging step, and
wherein after the exchanging step, when the number of faults in a cache line in memories in the same rank as the faulty memory is not over a threshold and the total number of faults in the memories is over a threshold, a faulty memory page is blocked in the blocking step.

17. The method according to claim 14, further comprising: third counting which counts the total number of faults in a cache line in memories in each of the ranks;
wherein when the total number of faults in a single cache line in the memories in a rank is over a threshold and the total number of faults in the memories is not over a threshold, a memory page corresponding to the single cache line is blocked in the blocking step.

18. The method according to claim 11, wherein a threshold of the total number of faults in the memories is larger than a threshold of the number of faults in a cache line.

19. The apparatus according to claim 17, wherein a threshold of the total number of faults in a cache line in memories in each of the ranks is smaller than a threshold of the total number of faults in the memories, and
wherein the threshold of the total number of faults in a cache line in memories in each of the ranks is larger than a threshold of the total number of faults in the memories.

20. The method according to claim 11, wherein a memory is a memory chip and a spare memory is a spare memory chip.

21. A non-transitory computer readable medium having recorded thereon a program for enabling a computer to carry out a method, comprising:
first counting which counts the total number of faults in a plurality of memories;
exchanging a faulty memory with a spare memory when the total number of faults in the memories is over a threshold;
second counting which counts the number of faults in cache lines in the memories after the faulty memory is switched with the spare memories; and
blocking a memory page corresponding to the single cache line when the number of faults in a single cache line is over a threshold.

22. The computer readable medium having recoded thereon a program according to claim 21, the program further including instruction for causing:
resetting the total number of faults in the memories after the exchanging step, and
wherein after the exchanging step, when the number of faults in a cache line is over a threshold and the total number of faults in the memories is not over a threshold, a memory page corresponding to the cache line is blocked in the blocking step.

23. The computer readable medium having recoded thereon a program according to claim 21, the program further including instruction for causing:
resetting the total number of faults in the memories after the exchanging step, and
wherein after the exchanging step, when the number of faults in a cache line is not over a threshold and the total number of faults in the memories is over a threshold, a memory page corresponding to the cache line is blocked in the blocking step.

24. The computer readable medium having recoded thereon a program according to claim 21, the program further including instruction for causing:
determining a plurality of ranks each of which includes a plurality of memories and a spare memory; and
determining whether or not a faulty memory in a rank is exchanged with a spare memory in the rank;
wherein a faulty memory is exchanged with a spare memory in the same rank as the faulty memory when the total number of faults in the memories is over a threshold in the exchanging step, and
wherein after the exchanging step, the number of faults in cache lines in the memories in the same rank as the faulty memory is counted in the second counting step.

25. The computer readable medium having recoded thereon a program according to claim 24, the program further including instruction for causing:
resetting the total number of faults in the memories after the exchanging step, and
wherein after the exchanging step, when the number of faults in a cache line in memories in the same rank as the faulty memory is over a threshold and the total number of faults in the memories is not over a threshold, a memory page corresponding to the cache line is blocked in the blocking step.

26. The computer readable medium having recoded thereon a program according to claim 25, the program further including instruction for causing:
resetting the total number of faults in the memories after the exchanging step, and
wherein after the exchanging step, when the number of faults in a cache line in memories in the same rank as the faulty memory is not over a threshold and the total number of faults in the memories is over a threshold, a faulty memory page is blocked in the blocking step.

27. The computer readable medium having recoded thereon a program according to claim 24, the program further including instruction for causing:
third counting which counts the total number of faults in a cache line in memories in each of the ranks;
wherein when the total number of faults in a single cache line in the memories in a rank is over a threshold and the total number of faults in the memories is not over a threshold, a memory page corresponding to the single cache line is blocked in the blocking step.

28. The computer readable medium having recoded thereon a program according to claim 21,
wherein a threshold of the total number of faults in the memories is larger than a threshold of the number of faults in a cache line.

29. The computer readable medium having recoded thereon a program according to claim 27,
wherein a threshold of the total number of faults in a cache line in memories in each of the ranks is smaller than a threshold of the total number of faults in the memories, and
wherein the threshold of the total number of faults in a cache line in memories in each of the ranks is larger than a threshold of the total number of faults in the memories.

30. The computer readable medium having recoded thereon a program according to claim 21, wherein a memory is a memory chip and a spare memory is a spare memory chip.

31. A system comprising:

an information processing apparatus configured to include a first counting unit, a switching unit and a second counting unit; and a memory device configured to include a plurality of memories and a spare memory, wherein the first counting unit is configured to count the total number of faults in the plurality of memories in the memory device, wherein the switching unit is configured to exchange a faulty memory with the spare memory when the total number of faults in the memories in the memory device is over a threshold, wherein the second counting unit is configured to count the number of faults in cache lines in the memories after the faulty memory is switched with the spare memories, and wherein when the number of faults in a single cache line is over a threshold, a memory page corresponding to the single cache line is blocked.

* * * * *

UNITED STATES PATENT AND TRADEMARK OFFICE
CERTIFICATE OF CORRECTION

| | |
|---|---|
| PATENT NO. | : 8,261,137 B2 |
| APPLICATION NO. | : 13/009565 |
| DATED | : September 4, 2012 |
| INVENTOR(S) | : Takato Sekimoto |

It is certified that error appears in the above-identified patent and that said Letters Patent is hereby corrected as shown below:

In the Claims

Claim 19, Column 13, Line 28: delete "The apparatus according to claim 17," and insert -- The method according to claim 14, --

Signed and Sealed this
Sixteenth Day of December, 2014

Michelle K. Lee
*Deputy Director of the United States Patent and Trademark Office*